(12) United States Patent
Cornelius et al.

(10) Patent No.: US 6,873,172 B2
(45) Date of Patent: Mar. 29, 2005

(54) AUTOMATED LASER DIODE TEST SYSTEM

(75) Inventors: Paul Cornelius, Redwood City, CA (US); John Walsh, Livermore, CA (US); Yong Yim, San Jose, CA (US)

(73) Assignee: Bandwidth9, Inc., Fremont, CA (US)

( * ) Notice: Subject to any disclaimer, the term of this patent is extended or adjusted under 35 U.S.C. 154(b) by 269 days.

(21) Appl. No.: 10/146,709

(22) Filed: May 14, 2002

(65) Prior Publication Data

US 2002/0186744 A1 Dec. 12, 2002

Related U.S. Application Data

(60) Provisional application No. 60/290,915, filed on May 14, 2001.

(51) Int. Cl.[7] .............................................. G01R 31/26
(52) U.S. Cl. ...................... 324/767; 324/158.1; 702/183
(58) Field of Search .............................. 324/767, 158.1, 324/760, 765, 766; 702/182, 183, 185

(56) References Cited

U.S. PATENT DOCUMENTS

| | | | | |
|---|---|---|---|---|
| 3,736,506 A | | 5/1973 | Griffin ..................... | 324/158 R |
| 4,489,477 A | | 12/1984 | Chik et al. ..................... | 29/569 |
| 4,775,640 A | * | 10/1988 | Chan ........................... | 438/16 |
| 6,510,402 B1 | * | 1/2003 | Logan et al. ............... | 702/186 |
| 6,539,384 B1 | * | 3/2003 | Zellner et al. ................ | 707/10 |
| 6,597,195 B1 | * | 7/2003 | Beaudry et al. ............. | 324/767 |
| 6,665,634 B2 | * | 12/2003 | Taft et al. .................... | 702/186 |
| 6,711,731 B2 | * | 3/2004 | Weiss ........................... | 716/19 |
| 6,795,799 B2 | * | 9/2004 | Deb et al. .................... | 702/188 |

* cited by examiner

Primary Examiner—Ernest Karlsen
(74) Attorney, Agent, or Firm—Heller Ehrman White & McAuliffe LLP

(57) ABSTRACT

An automated laser diode testing and burn-in system is disclosed. Initial device data is obtained by applying current to the device at room temperature and measuring the device parameters. The device is then subjected to a burn-in process at higher temperatures. Device performance is monitored throughout the burn-in process. Upon termination of the burn-in process the devices are cooled to room temperature and the post burn-in device power is measured again under the same test conditions. If the device parameters have changed by more than a particular amount the device is rejected. Otherwise, the device is accepted and installed in the next level assembly. The test system disclosed herein achieves significant advantages over prior art in cost and throughput by combining an easy to load laser test fixture with automatic device hold down feature, heating capability, computer program driven test protocol capable of performing initial laser measurements, calibrating each laser and photodetector pair, burn-in test, post burn-in measurements, failed device detection, storage of laser test history records and enabling remote access to such records. The invention eliminates the need for numerous labor intensive ergonomically difficult steps and costly test fixtures.

17 Claims, 9 Drawing Sheets

AUTOMATED LASER DIODE TEST SYSTEM

CROSS-REFERENCE TO RELATED APPLICATIONS

This application claims the benefit of U.S. Ser. No. 60/290,915 filed May 14, 2001, which application is fully incorporated herein by reference.

BACKGROUND OF THE INVENTION

1. Field of the Invention

This invention relates to the field of reliability test systems, and more particularly to a test system that tests the reliability of optical devices such as diode lasers, and more specifically, tunable lasers.

2. Description of Related Art

Laser diodes are a substantial and fast growing constituent of optical communications networks. Such optical systems include, but are not limited to, telecommunication systems, cable television systems, and Local Area Networks (LANs). Optical systems are described in Gowar, Ed. Optical Communication Systems, (Prentice Hall, N.Y.) c. 1993 and Agrawal, G. Fiber-Optic Communications System, Wiley, 1997, the disclosures of which are incorporated herein by reference. Currently, the majority of optical systems are configured to carry an optical channel of a single wavelength over one or more optical wave-guides. To convey the information form plural sources, time division multiplexing is frequently employed (TDM). In time division multiplexing, a particular time slot is assigned to each information source, the complete signal being constructed from the signal collected from each time slot. While this is a useful technique for carrying plural information sources on a s single channel, its capacity is limited by fiber dispersion and the need to generate high peak power pulses.

While the need for communication systems increases, the current capacity of existing wave-guiding media is limited. Although capacity may be expanded, e.g. by laying more fiber optic cables, the cost of such expansion is prohibitive. Consequently, there exists a need for a cost-effective way to increase the capacity of the existing optical wave-guides.

Wavelength division multiplexing (WDM) and dense wavelength division multiplexing (DWDM) have been explored as approaches for increasing the capacity of the existing fiber optic networks. Such systems employ plural optical signal channels, each channel being assigned a particular channel wavelength. In a typical system, optical signal channels are generated, multiplexed to form an optical signal comprised of the individual optical signal channels, transmitted over a single wave-guide, and de-multiplexed such that each channel wavelength is individually routed to a designated receiver. Through the use of optical amplifiers, such as doped fiber amplifiers, plural optical channels are directly amplified simultaneously, facilitating the use of WDM and DWDM approaches in long distance optical systems.

The desire to harvest the benefits offered by these new technologies requires the incorporation of rapidly evolving state-of-the art components for which there has been no prior use and about which little is known in detail. Substantial emphasis must then be placed upon strategies for the early detection of system-threatening premature failures that may occur. These strategies are based upon a priori considerations, rather than extensive manufacturing and field experience. There has to be as much focus upon the possible as upon the probable failure modes. Since WDM and DWDM are driving exponential increase in demand for the components, dramatic shift in manufacturing techniques to achieve higher yields and improve device reliability are required.

Discrete diode lasers for use in telecommunications equipment are typically coupled to fiber-optic amplifiers. The expected operating life of telecommunications equipment is over 20 years, necessitating implementation of a protocol assuring the reliability of diode lasers, subassemblies, and ultimately of the entire telecommunications systems. Typically, the laser diodes are intended for use in an environment whose temperature is as high as 85 Degrees Celsius. The performance of the diode lasers varies with temperature. Typically, peak wavelength, threshold current and operating current will shift by certain amount at elevated temperatures. The telecommunications systems are designed to accommodates certain amount of shift in laser parameters and still perform satisfactorily. Some of the devices, however, will continue to shift during the operation until they ultimately fail, and also cause the ultimate failure of the communications system. The system requirements, therefore, necessitate that diode lasers pass certain reliability criteria that will assure a minimal acceptable drift in their parameters and provide satisfactory performance over the long life of the communications system. The purpose of reliability testing, therefore, is to screen out and reject the devices that would not pass the required criteria. As an example of the approach employed, a typical diode laser power v. current behavior prior to and post burn in is shown in FIG. 1(a). The shift shown, if beyond the system specification, will cause the device to be rejected.

Traditionally, laser testing and burn-in were primarily accomplished by numerous manual steps which required significant operator to test equipment interactions. Most laboriously, the photodetector calibration, required to be done at start of each measurement, when done manually, is very time consuming and needs to be repeated with regularity. The data collection schemes involved either manual recording systems or stand alone non communicating individual test systems. The traceability of data had to be accomplished manually and remote accessibility of test data for future failure analysis were virtually non existent.

There is a need for a test system that eliminates virtually all the labor intensive steps, automatically performs laser to photodetector calibration and enables all system components to function together.

SUMMARY OF THE INVENTION

Accordingly, an object of the present invention is to provided an improved automated test system, and its methods of use.

Another object of the present invention is to provide an improved automated test system, and its methods of use, that determines a laser's capability to perform in a communications system.

Yet another object of the present invention is to provide an improved automated test system, and its methods of use that provides automation of a testing procedure by automatically calibrating each laser to a corresponding photodetector, and establishing communication between all key test system component.

These and other objects of the present invention are achieved in an automated laser testing system. A heater is provided assembly for holding lasers to be tester. A detector assembly is coupled to the heater assembly. A burn-in fixture receives the heater and detector assemblies. An electrical circuit monitors power level at the device being tested and adjusting the power as required. A module identifies each heater assembly and retrieving a test plan.

In another embodiment, a method for testing lasers provides a browser user interface module to a server. A module is provided that enables communications between the server, a parametric tester and an embedded controller. Test parameters and test data collected are stored and received which enables information retrieval by a plurality of local and remote users.

DETAILED DESCRIPTION

In various embodiments, the present invention provides test systems, and their methods of use, for automatically testing light emitting devices including but not limited to lasers. In one embodiment, the devices are subjected to an electrical test where an appropriate amount of current is applied according to the type of the device. The test system records the power output for each device. Other parameters also may be recorded. The devices are then subjected to a burn-in process for a period of time. Upon completion of the burn-in process the devices are allowed to cool to room temperature. The same test done before the burn-in is now repeated. The amount of change form the initial reading is recorded for each device. Devices that exceed the amount of allowable change are rejected. Those that remain within specification are passed on to the next level of assembly. The test system stores all the test data and the date may be retrieved for each device directly or remotely form the test system.

Figure 1A:
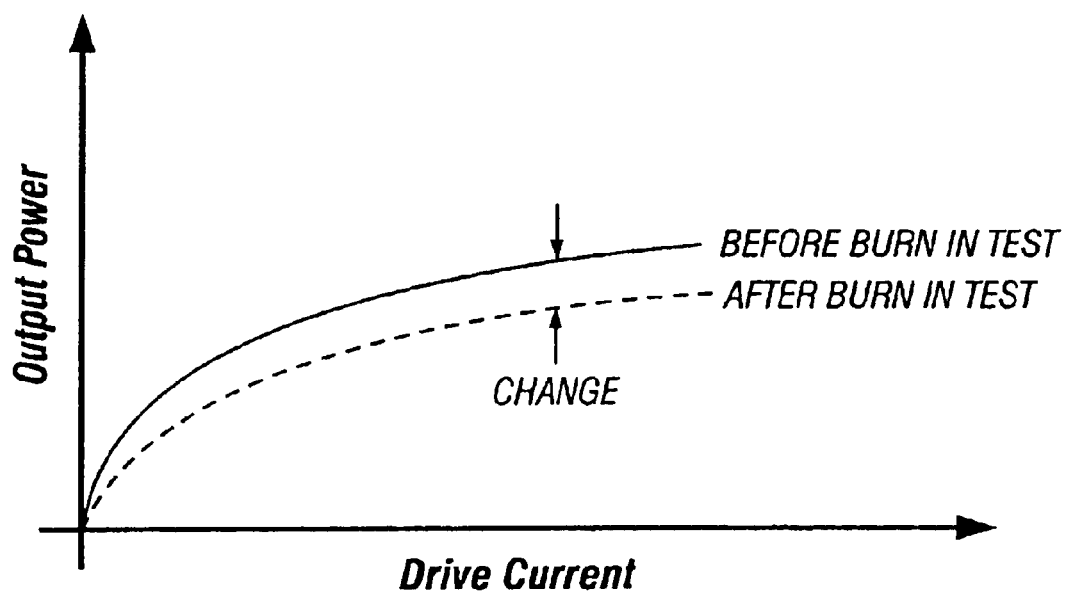
FIG. 1(a) shows a typical laser behavior before and after the burn-in test and includes a tunable device.
Figure 2:
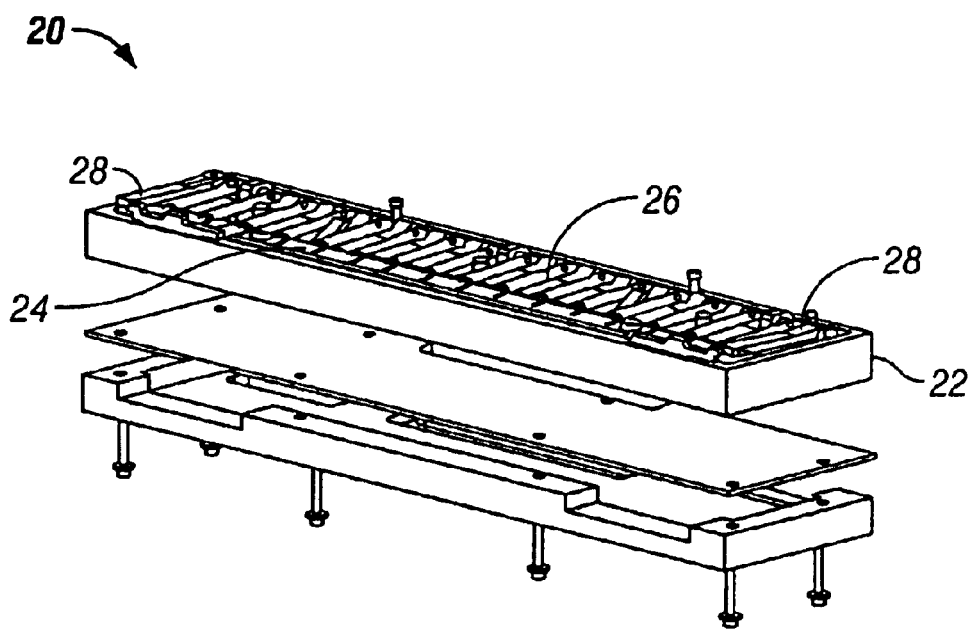
FIG. 2 illustrates a heater assembly fixture with individual slots for laser placement, laser hold down mechanism and the detector to the heater assembly cooperation that can be utilized with the FIG. 1(b) embodiment.
Figure 1B:
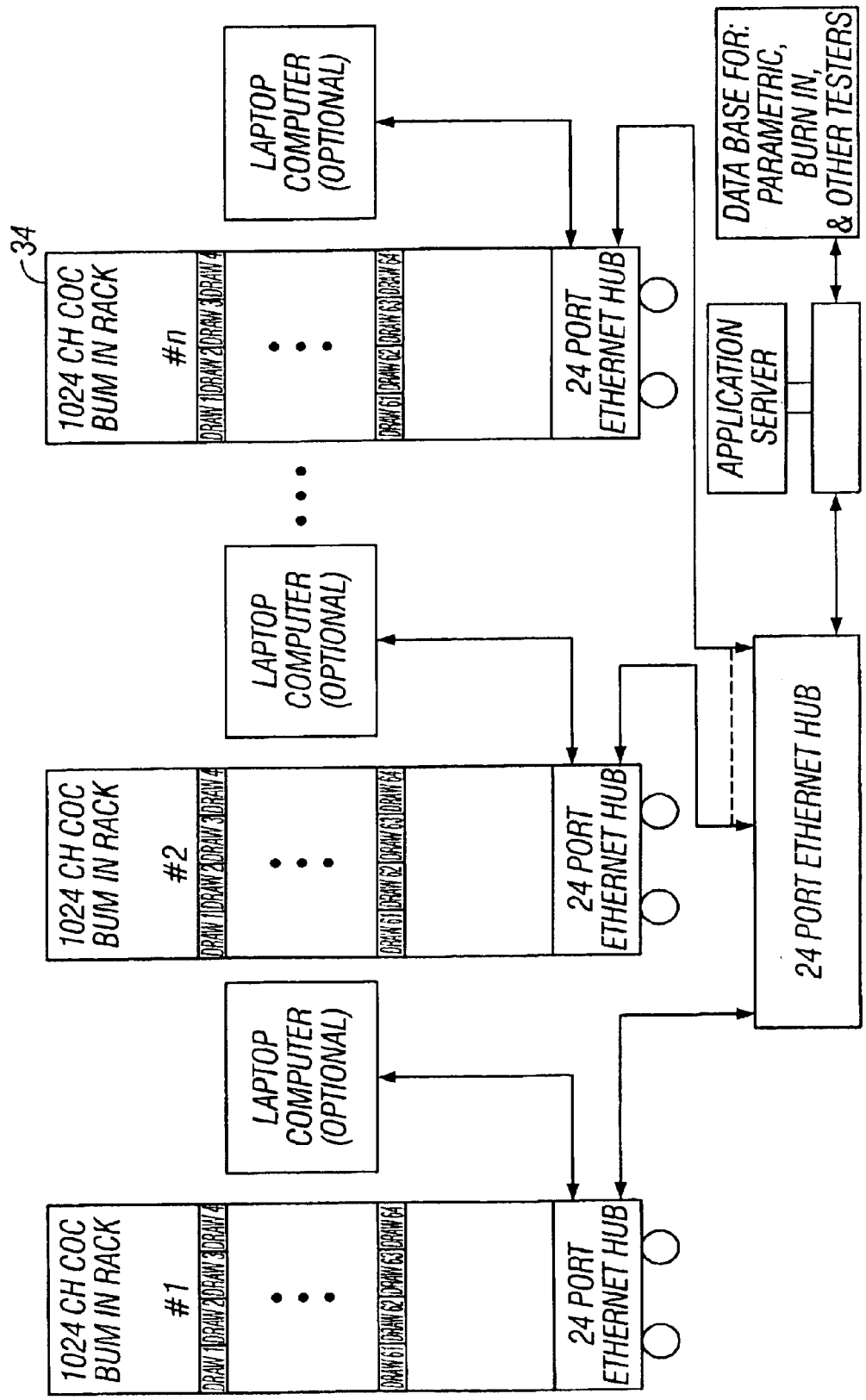
FIG. 1(b) is a block diagram of one embodiment of the present invention.
Figure 3:
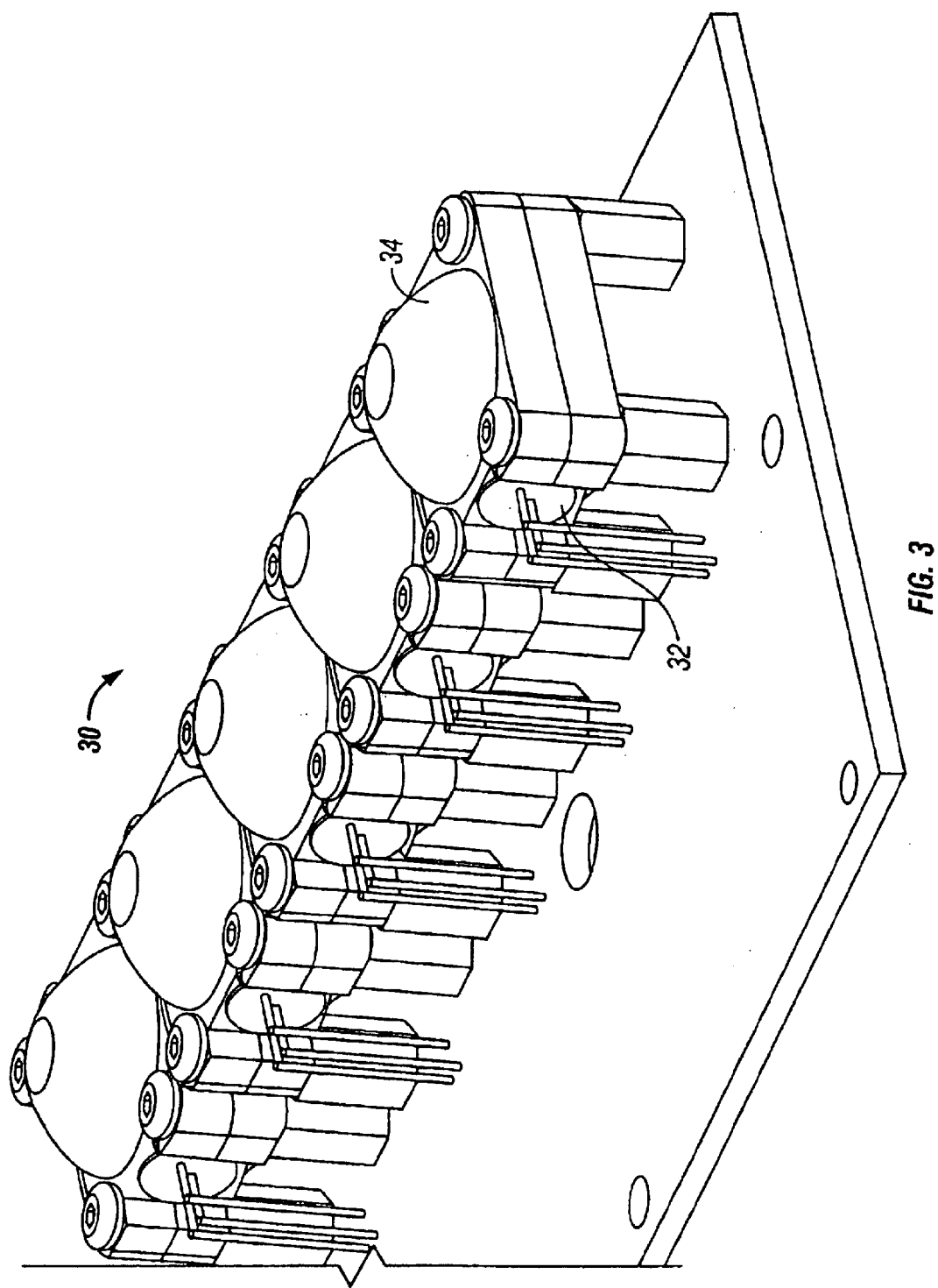
FIG. 3 illustrates one embodiment of a detector and integrating sphere assembly that can be utilized with the FIG. 1(b) embodiment.
Figure 4A:
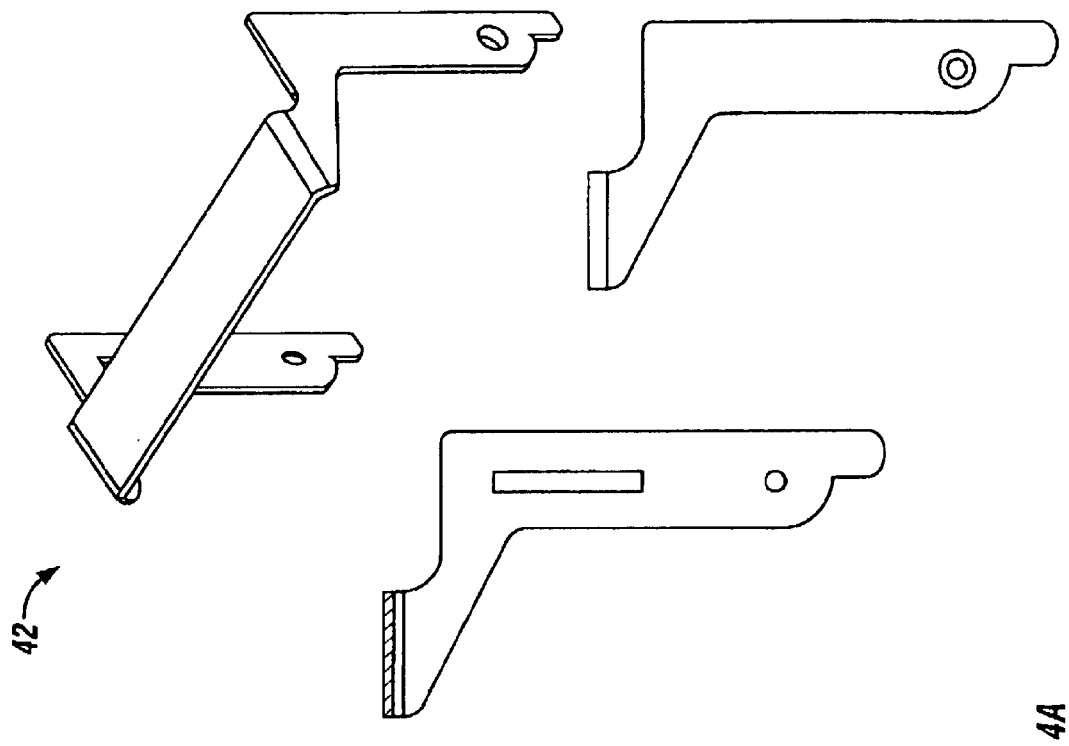
FIGS. 4(a) and 4(b) illustrate a burn-in fixture that can be utilized with the FIG. 1(b) embodiment.
Figure 4A:
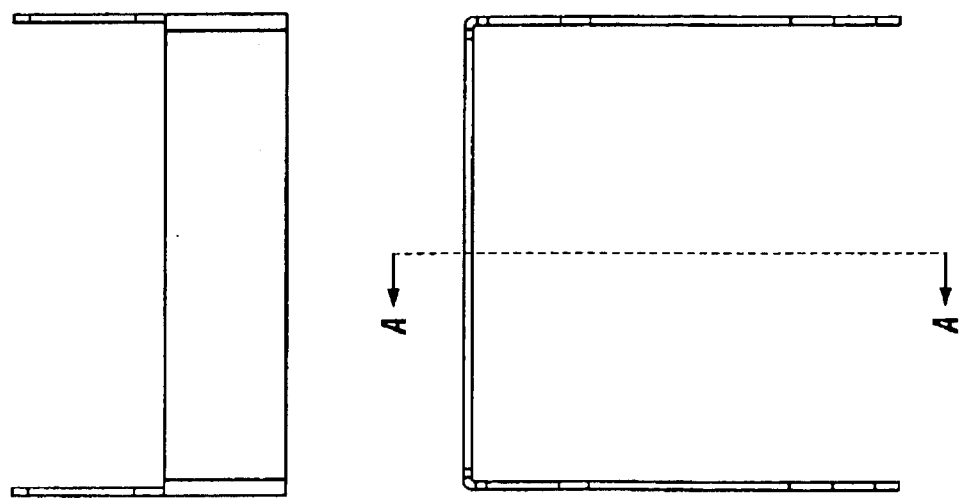
Figure 4B:
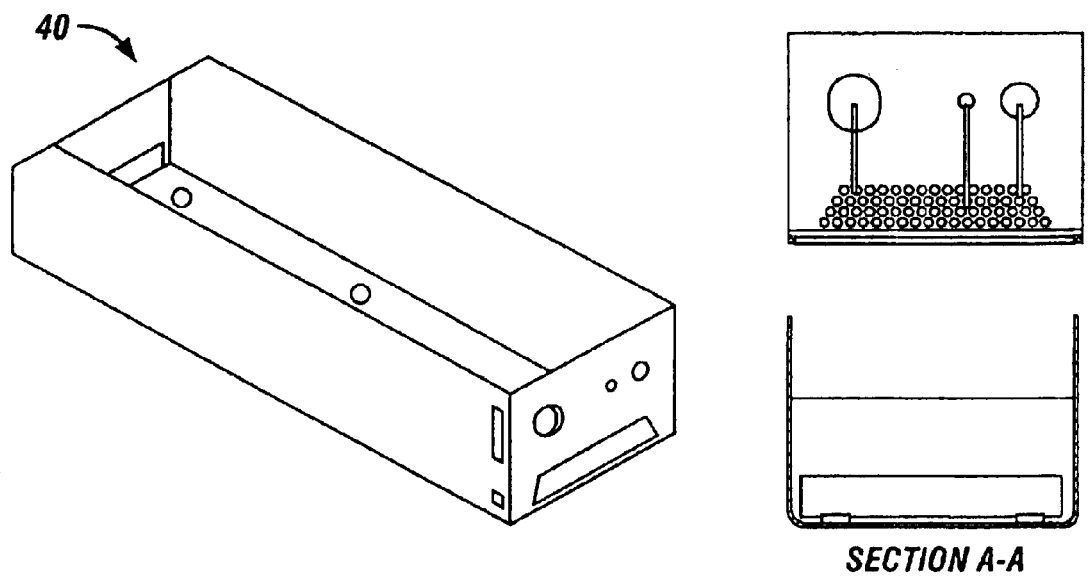
Figure 4B:
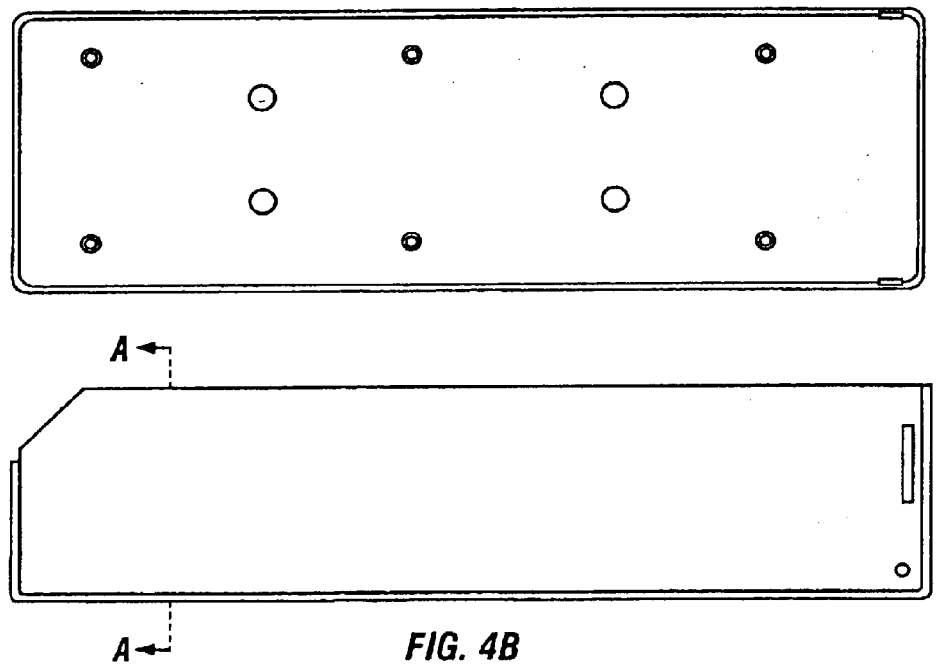
Figure 5:
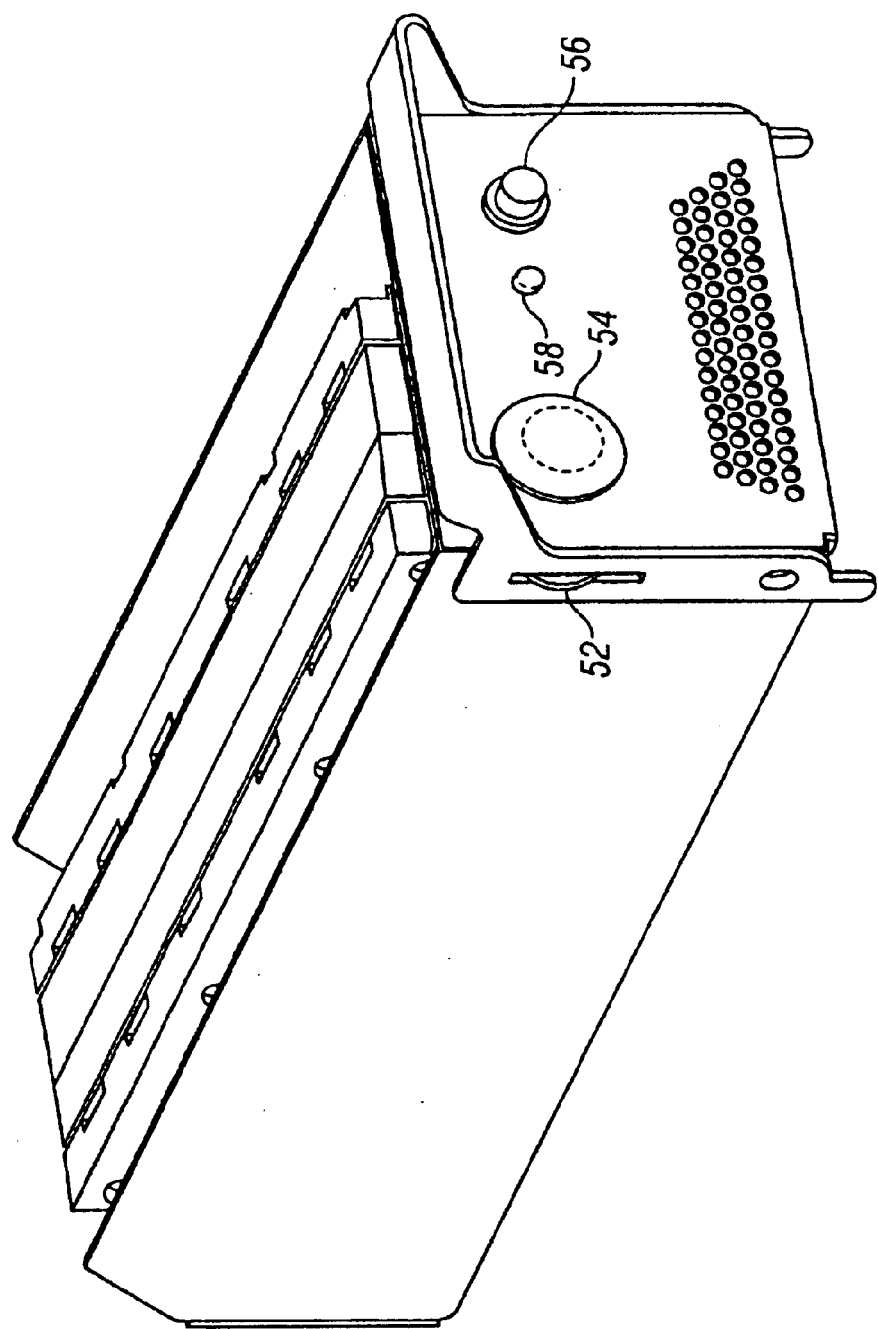
FIG. 5 is a diagram that illustrates a burn-in fixture with the heater and detector assemblies loaded therein that can be utilized with the FIG. 1(b) embodiment.
Figure 6:
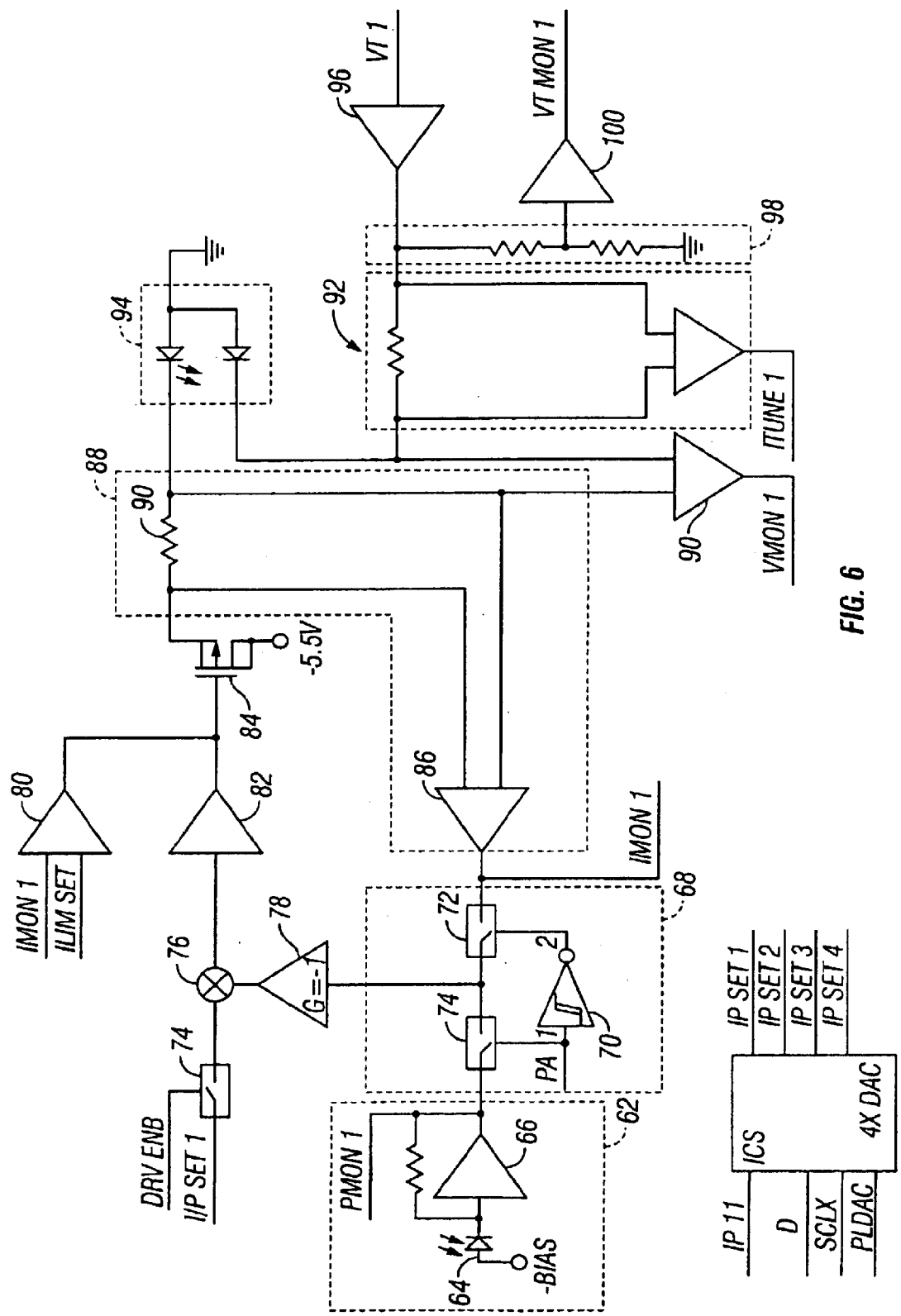
FIG. 6 illustrates one embodiment of the portion of the electrical circuitry needed to sense and adjust test parameters during the burn-in test.

Referring now to FIG. 1(b), one embodiment of an automated laser testing system 10 includes a heater assembly 20, as shown in FIG. 2 that is configured to hold lasers to be tested. A detector assembly 30, illustrated in FIG. 3, is coupled to heater assembly 20 as shown in FIG. 5. A burn-in fixture 50, FIG. 4, accommodates heater assembly 20 and detector assembly 30 and a computer driven test program. The computer driven program is capable of reading the identity of each heater assembly 20 and applies an electrical signal to obtain initial test data, calibrates each detector, performs burn-in, and then tests the lasers after the burn-in Turning now to FIG. 2, base 22 of heater assembly 20 is made of material resistant to electrostatic charge which can also withstand elevated temperatures. Such materials may be, but are not limited to Ultem, polycarbonate or other materials with similar electrostatic andrmal properties lasers are placed into individual slots 24 and are held in place by spring hold-down mechanism 26 that is further held-down by two holding arms 28, arms 28 being integral to heater assembly. When subsequently deactivated, holding unit releases all lasers simultaneously. The temperature of heater assembly 20 is maintained by computer controlled heaters disposed internally to heater assembly.

Figure 7:
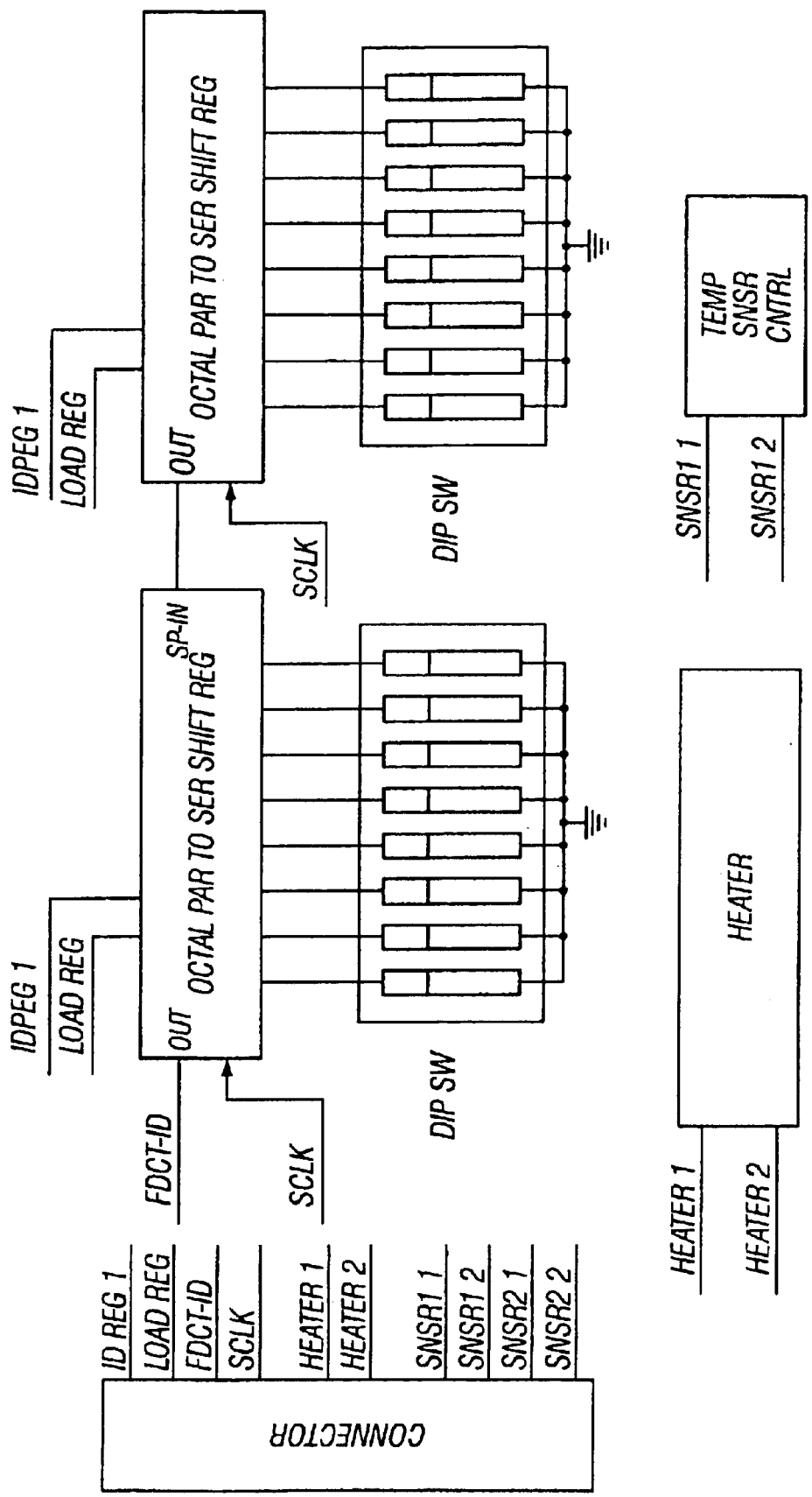
FIG. 7 illustrates one embodiment of a heater assembly fixture identification block of the present invention.
Figure 8:
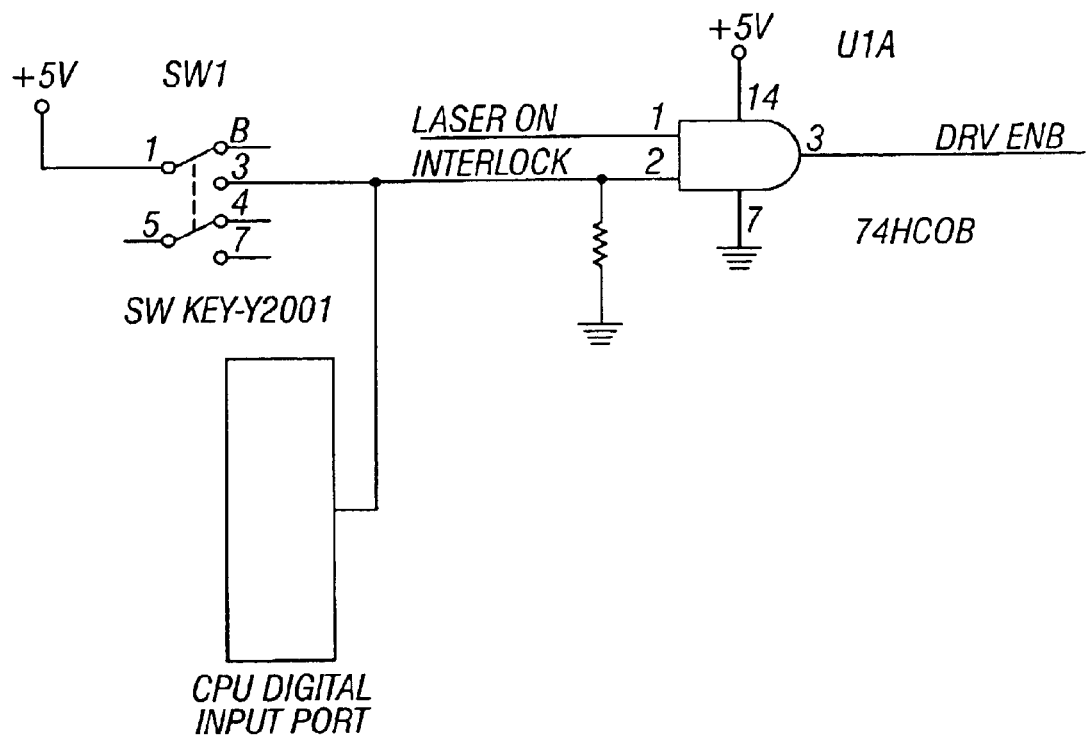
FIG. 8 illustrates one embodiment of a electrical interlock for the burn in fixture of the present invention.

Each heater assembly 20 carries its own, computer readable identification. Temperature control can be accomplished by proper incorporation of a silicon integrated circuit transducer, and heater assembly identification similarly by using a parallel to serial shift register shown in FIG. 7.

Each photo detector 32 shown in FIG. 3 needs to be calibrated for the particular laser it is associated with. This can be achieved by using an integrating sphere 34 in conjunction with each photo detector 32. Integrating sphere 34 is coated with reflective materials. The use of reflective materials makes it possible to collect light generated by the laser and reflect it in direction of photo detector 32. This provides a determine calibration set point for each photo detector. Integrating sphere 34 can be made of a variety of different materials, including but not limited to polycarbonate or lexan materials coated with titanium and gold or other reflective coatings. Detector assembly 30 is further coupled to heater assembly 20 for placing into a burn in test position. Burn in fixture 40, shown in FIGS. 4(a) and 4(b), can house heater assembly 20 and detector assembly 30 as one unit. A movable handle 42 can be included in order to provide for ease of handling and loading onto burn in system 10. A latching mechanism 54, FIG. 5, locks burn in fixture 40 to system 10. When a burn in fixture is properly positioned, a key operated electrical interlock 54 allows for a test to be started by test start unit 56. A test indicator light 58 shows that a test is in progress.

A transimpedance 62 and toggle switch 68 circuits make it possible to select either constant current or constant power burn-in conditions. Transimpedance circuit 62 can include a photodetector 64 and a high input impedance operational amplifier 66. Operational amplifier 66 converts photodector current into a voltage signal. Toggle switch 68 can include a Schmitt trigger inverter 70 in combination with two analog switches 74 and 72. This arrangement makes it possible to toggle between transimpedance and current sections. This enables a constant power burn-in test. Inverting operational amplifier 78 connected to toggle switch 68 and causes current to flow in a desired direction. Summing junction 76 assures that current sum at that point equals zero. Enable/disable switch 74 provides power to circuit Controlling operational amplifier 80 sets current flow to a ser at desired value. Current boosting power transistor 84 allows current to rise to level needed.

A differential amplifier 82 sets an upper limit on current flowing to a laser 94. Current sensing circuit 88 can include a differential operational amplifier 86 and a resistor 90 at its input. Current sensing circuit 88 measures laser current and provides feedback to control circuit if it is in constant current mode, and monitors current if it is in a constant power mode. Another differential operational amplifier 90 measures voltage across laser 94.

If laser 94 is a tunable laser, tuning voltage is supplied by an operational amplifier 96. Voltage is monitored by a voltage divider 98 and a buffer operational amplifier 100. This data is stored for further analysis. Another differential amplifier 92 monitors current leakage resulting from the application of tuning voltage to laser 94. This data is stored for subsequent analysis.

Figure 9:
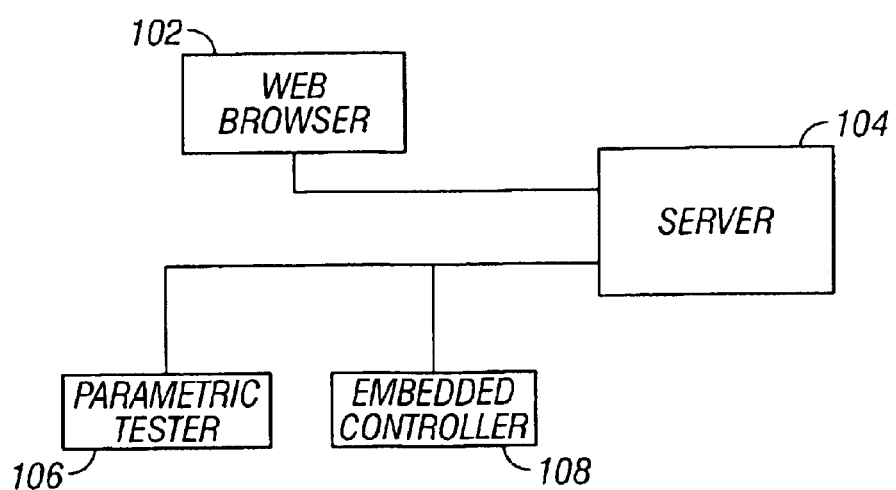
FIG. 9 is a block diagram of one embodiment of a communication system of this invention that can be utilized with the present invention.

FIG. 9 is a block diagram that illustrates communication of web browser 102, server 104, parametric tester 106 and one or more embedded controller(s) 108. Browser 102 provides for user interface to system server 104 communicates with parametric tester 106 and embedded controller(s) 108 by means including but not limited to Transfer Control Protocol/Internet Protocol (TCP/IP). TCP/IP enables real time cooperation between parametric tester 106 and embedded controllers 108. Server 104 also stores and retrieves test data from different data bases, serves web pages to users on network by means of TCP/IP protocol, stores and retrieves test plans for parametric testers and burn-in racks, enables remote access to system, compares pre and post burn-in test data and rejects devices that have changed by more than a particular amount, communicates status of burn-in system, location and status of devices under test, enables access to all data collected during burn-in parametric tests and maintains traceability of each laser's test history and its location within heater assembly.

In one embodiment, parametric tester 106 performs a calibration if required and electrical tests on each device per stored test plan and according to device type. A user places a loaded heater assembly 20 onto parametric tester 106. A fixture is identified by reading a parallel to series shift register device imbedded into fixture user accesses fixture's web page, enters a serial number for each device and assigns a test plan according to device type as stored in server 104. Most commonly, parametric tester 106 measures device output power at a fixed current value. For tunable lasers, test requires application of tuning voltage at time of test.

Embedded controller 108 performs burn-in test and supporting functions. It detects insertion and removal of heater and detector assembly units, and informs server 104 when such insertion and removal occurs. It identifies test fixture being used, retrieves initial calibration data and test plans from server 104, performs calibration of each detector at beginning of each burn-in run, applies appropriate drive signals (current, tuning voltage, etc) to each device during burn-in test as specified by test plan, measures device performance during run at intervals specified by test plan, transfers test data acquired during each burn-in run to server at regular intervals, monitors temperature of each heater unit and suspends burn-in run in event of an error, and terminates burn-in run after an elapsed time specified by test plan and communicates end of test information to server.

Upon test termination, burn-in fixture is removed from embedded controller(s) 108 and allowed to cool to room temperature before parametric test is repeated and device disposition determined.

The foregoing description of a preferred embodiment of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

What is claimed is:

1. A method for testing lasers, comprising:

providing a browser user interface module to a server, providing a module enabling communications between the server, a parametric tester and an embedded controller; and storing and retrieving test parameters and test data collected and enabling information retrieval by a plurality of local and remote users.

2. The method of claim 1, further comprising:

maintaining traceability of test data for each of a laser tested and to a specific location within a heater assembly.

3. The method of claim 2, further comprising:

detecting a location of a plurality of heater assemblies.

4. The method of claim 3, further comprising:

identifying each heater assembly.

5. The method of claim 1, further comprising:

recording a laser serial number for each of a tested laser.

6. The method of claim 1, further comprising:

performing a laser parametric test for each of a laser.

7. The method of claim 6, further comprising:

performing a calibration of each laser and a detector combination.

8. The method of claim 7, further comprising:

monitoring and adjusting a temperature of each of a laser tested to a predetermined value.

9. The method of claim 8, further comprising:

terminating a burn-in testing of each of a laser tested that does not conform to a predetermined value.

10. The method of claim 9, further comprising:

comparing a pre burn-in to a post burn-in a laser parametric test result; and rejecting each of a tested laser when the laser parametric test result exceeds a predetermined value.

11. The method of claim 10, further comprising:

providing an embedded controller member for identifying each heater assembly; and retrieving predetermined burn-in test conditions from the server.

12. The method of claim 11, further comprising:

continually monitoring temperature of lasers being tested.

13. The method of claim 12, further comprising:

providing a constant current or a constant power burn-in condition to lasers being tested.

14. The method of claim 13, further comprising:

measuring and adjusting test parameters to obtain constant power conditions for tested lasers.

15. The method of claim 14, further comprising:

storing laser test data and communicating the data to the server.

16. The method of claim 15, further comprising:

restarting a burn-in test if an interruption occurs during burn-in.

17. The method of claim 16, further comprising:

terminating the burn-in test and communicating the test termination message to the server.

* * * * *